United States Patent [19]

Okayasu et al.

[11] Patent Number: 6,094,085
[45] Date of Patent: Jul. 25, 2000

[54] DRIVER CIRCUIT WITH TEMPERATURE CORRECTION CIRCUIT

[75] Inventors: Toshiyuki Okayasu; Satoshi Iwamoto, both of Tokyo, Japan

[73] Assignee: Advantest Corp., Tokyo, Japan

[21] Appl. No.: 09/121,953

[22] Filed: Jul. 24, 1998

Related U.S. Application Data

[63] Continuation-in-part of application No. 08/913,350, Feb. 9, 1998, Pat. No. 5,973,542.

[30] Foreign Application Priority Data

Mar. 6, 1996 [JP] Japan ........................................ 8-78228
Jan. 20, 1997 [JP] Japan ........................ PCT/JP97/00103

[51] Int. Cl.[7] ................................................ H03K 17/14
[52] U.S. Cl. ........................ 327/378; 327/513; 327/541
[58] Field of Search ...................................... 327/513, 512, 327/378, 108–112, 379, 389, 391, 436, 437, 538, 540, 541; 326/32

[56] References Cited

U.S. PATENT DOCUMENTS

4,975,598  12/1990  Borkar ........................................ 326/32
5,021,684   6/1991  Ahuja et al. ............................... 326/27
5,376,846  12/1994  Houston .................................... 327/513

*Primary Examiner*—Timothy P. Callahan
*Assistant Examiner*—Minh Nguyen
*Attorney, Agent, or Firm*—Muramatsu & Associates

[57] ABSTRACT

A driver circuit having a temperature correction circuit for producing an output signal with high precision amplitude and timing by correcting the temperature changes in the amplitude and timing. The temperature correction circuit includes a temperature detector for detecting the temperature change in output elements, a timing adjustment circuit for correcting the timing of an output signal relative to an input signal upon receiving the temperature detection signal from the temperature detector, and a bias circuit for correcting the output amplitude and impedance of the output signal.

13 Claims, 11 Drawing Sheets

DRIVER CIRCUIT WITH TEMPERATURE CORRECTION CIRCUIT

This is a continuation-in-part of U.S. patent application Ser. No. 08/913,350 filed Feb. 9, 1998 U.S. Pat. No. 5,973, 542.

FIELD OF THE INVENTION

This invention relates to a temperature correction circuit for a driver circuit which outputs pulse signals to be used in electrical instruments, and more particularly, to a temperature correction circuit used in a driver circuit which is capable of generating an output signal having a stable and high accuracy amplitude and timing in spite of temperature changes in the driver circuit.

BACKGROUND OF THE INVENTION

FIG. 4 is a block diagram showing an example of the last stage of a driver circuit in the conventional technology having a complementary configuration. In this example, the last stage of the driver circuit is comprised of a bias circuit 40, output elements 31 and 32, and an impedance matching resistor 4. FIG. 5 shows a more detailed structure of the driver circuit of FIG. 4 which is used, for example, as a pin driver circuit in a test channel of a semiconductor test system. In such a semiconductor test system, the pin driver circuit is to apply a test signal to a corresponding one of device pins of a semiconductor device under test (DUT). The example of driver circuit in FIG. 5 has no temperature correction circuit.

The output elements 31 and 32 in this example are formed with CMOS transfer gates. The output elements 31 and 32 in the last stage of the driver circuit consumes a large portion of the power consumption of the driver circuit. The amount of the power consumption varies depending on waveforms of pulse signals provided to the output elements as well as operating speeds of the output elements. Because of the changes in the power consumption, junction temperature of the output elements also changes, which fluctuates the performance of the driver circuit. Consequently, the output amplitudes and edge timings vary from what originally intended.

FIG. 6 shows an example of drain current curves versus gate voltages in the output element formed with CMOS transfer gates when the temperature changes. In general, when the temperature in the MOS transistor devices increases, a threshold voltage denoted by Vt and drain current denoted by Id will decrease. As a result, the drain current Id at the bias point 9 of FIG. 6 decreases. Because of this characteristics, a problem arises in the conventional driver circuit that an output voltage level drops with an elapse of time as shown in FIG. 7A.

Such an output voltage change caused by the temperature change in the output element increases with the increase in the amount of output current flowing to the load. This is because an output impedance of the output element varies with the increase of the temperature, and the output voltage is a product of the output current and the output impedance.

FIGS. 7B–7D show examples of timing deviation between an input signal and an output signal. FIG. 7C shows an intended delay timing of the output signal with respect to the input signal of FIG. 7B. FIG. 7C shows an additional delay time Δt occurred in the output signal with respect to the input signal of FIG. 7B because of the temperature rise in the output element. In this manner, the timing deviation in the output signal occurs when the temperature in the driver circuit changes. Accordingly, the present invention is directed to a driver circuit which is able to maintain the output impedance of the driver circuit constant as well as to maintain a signal propagation delay time constant.

For a driver circuit that requires a high degree of precision, an external apparatus must be installed to keep the temperature of an area surrounding the driver circuit in a constant value. Examples of such external apparats is a cooler or an air conditioner, which increases the cost and size of the driver circuit.

As explained in the foregoing, in the driver circuit without a temperature compensation capability, the output amplitudes and timings deviate from what originally intended because of the temperature change. Basically, such a temperature change is caused by the change in the power consumption in the output elements 31 and 32 in the driver circuit. Consequently, the driver circuit in the conventional technology is not able to produce output signals having amplitudes and timings with sufficient precision.

SUMMARY OF THE INVENTION

Therefore, it is an object of the present invention to provide a driver circuit with a temperature correction capability for generating output signals having amplitudes and timings with high stability.

It is another object of the present invention to provide a driver circuit having a temperature correction circuit which detects the temperature changes in output elements in the last stage of the driver circuit and compensates the temperature changes in the driver circuit.

It is a further object of the present invention to provide a variety of ways to detect the temperature changes in the output elements of the driver circuit or the temperature change in the driver circuit as a whole and compensates the temperature changes.

The temperature correction circuit of the present invention is based on the fact that the heat source in the driver circuit is primarily concentrated on the power consumed by the output elements of the driver circuit.

In one aspect of the present invention, the temperature correction circuit for the driver circuit includes: a temperature detector for detecting temperature variations in output elements or in a driver circuit chip as a whole; an output timing correction circuit for correcting output timing changes caused by the temperature variations in an output signal relative to an input signal when receiving the temperature detection signal from the temperature detector; and an output amplitude correction circuit for correcting output amplitude changes caused by the temperature variations in the output signal when receiving the temperature detection signal from the temperature detector.

By this arrangement, the temperature correction circuit is achieved for the driver circuit having output elements complementarily connected with each other. The driver circuit receives an input signal and generates an output signal of a predetermined output amplitude and timing. The driver circuit of the present invention can provide the output signal of highly stabilized amplitude and timing even though the temperature of the output elements changes.

One of the examples of temperature detector is a voltage measurement circuit which measures voltages representing electric currents flowing through the output elements. Alternatively, the temperature detector may be a temperature sensor which is provided in close proximity to the output elements in the driver circuit. Further, the temperature detector may be a temperature sensor for detecting the temperature of the driver circuit chip as a whole.

An example of the output timing correction circuit is a plurality of series connected gate circuits which vary their signal propagation delay time when receiving the temperature detection signal from the temperature detector. The positive and negative source voltages for the series connected gates are regulated based on the temperature detection signal, thereby controlling the signal propagation delay time in the series connected gates for correcting the timings of the output signal.

An example of the output amplitude and impedance correction circuit is a bias circuit which changes the signal amplitude when receiving the temperature detection signal from the temperature detector. The positive and negative source voltages for the bias circuit are regulated based on the temperature detection signal, thereby controlling the signal amplitude of the output signal relative to the input signal for correcting the amplitude and impedance change caused by the temperature change.

More specifically, the example of configuration of the driver circuit having the temperature correction circuit includes detection resistors 33 and 34 for detecting electric current flowing through the output elements 31 and 32, and electric power monitor circuits 35 and 36 for monitoring the temperature (current) of the output elements 31 and 32 based on the voltages across the detection resistors 33 and 34. The driver circuit further includes correction circuits 37 and 38 for generating correction signals 51, 52, 53 and 54 to be provided to a timing adjustment circuit 39 and to a bias circuit 40, respectively, when receiving temperature detection signals 22 and 23 from the electric power monitor circuits 35 and 36. The timing adjustment circuit 39 is provided for adjusting the timing of the output signal 3 relative to the input signal 1 when receiving the correction signals 53 and 54 from the correction circuits 37 and 38 to correct the changes in the output signal timing caused by the temperature changes. The bias circuit 40 is provided for generating the amplitude corrected output signal to the output elements 31 and 32 when receiving the correction signals 51 and 52 from the correction circuits 37 and 38, thereby establishing the output amplitude and impedance correction circuit.

DETAILED DESCRIPTION OF THE PREFERRED EMBODIMENT

Figure 1:
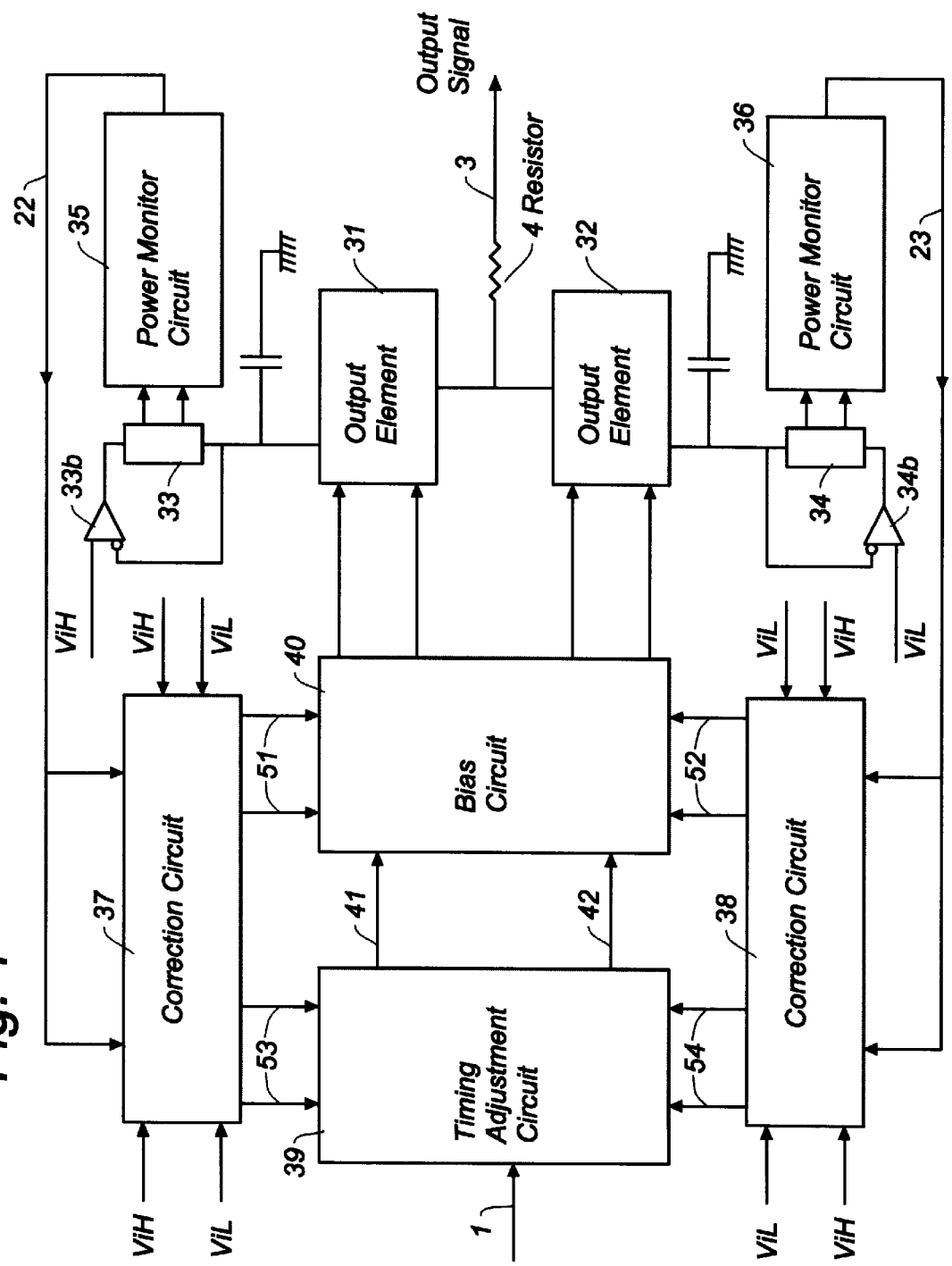
FIG. 1 is a block diagram showing a circuit structure of a driver circuit of the present invention having a temperature correction circuit.
Figure 2:
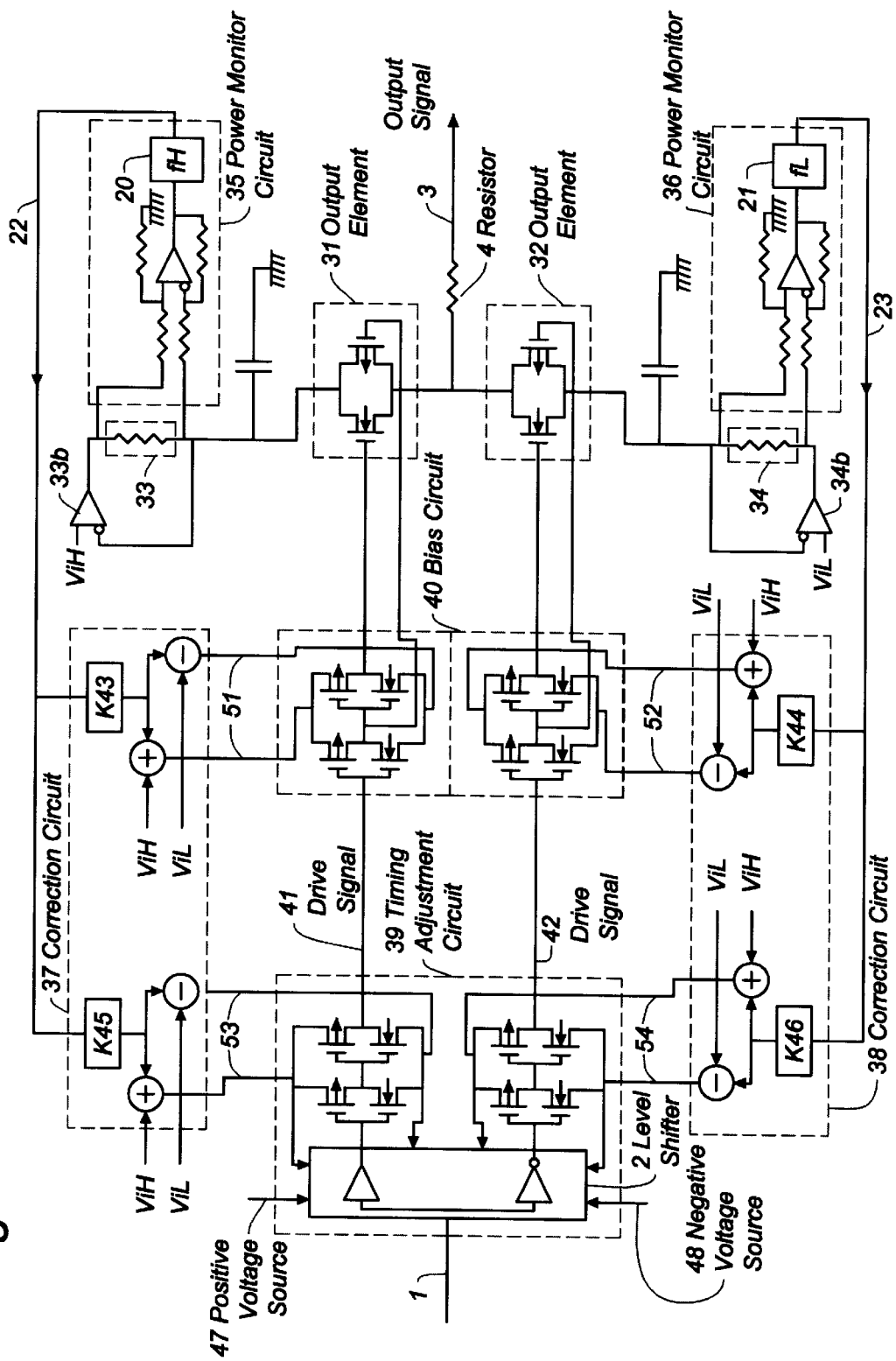
FIG. 2 is a circuit diagram showing a detailed circuit structure of a driver circuit of the present invention having the temperature correction circuit.

FIG. 1 is a block diagram showing a driver circuit having a temperature correction circuit of the present invention. FIG. 2 is a circuit diagram showing a more detailed circuit structure of the driver circuit having the temperature correction circuit of the present invention. FIGS. 3A–3D show input and output voltage relationships for explaining a principle of temperature correction of the present invention.

Figure 3A:
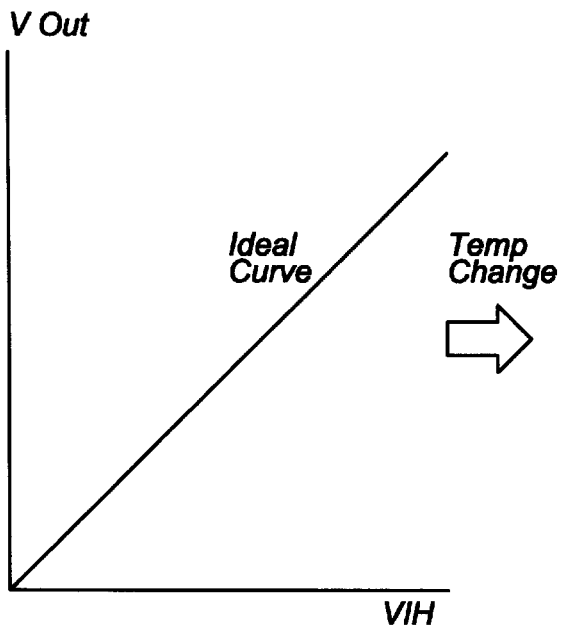
FIGS. 3A–3D are diagrams showing examples of input and output voltage relationship for explaining a principle of temperature correction of the present invention.
Figure 3B:
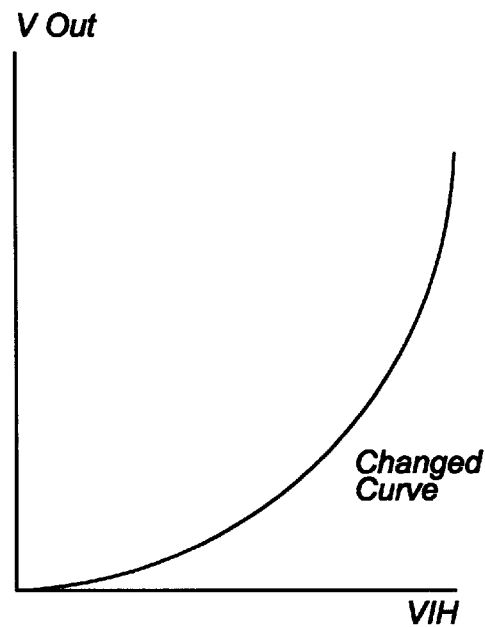
Figure 3C:
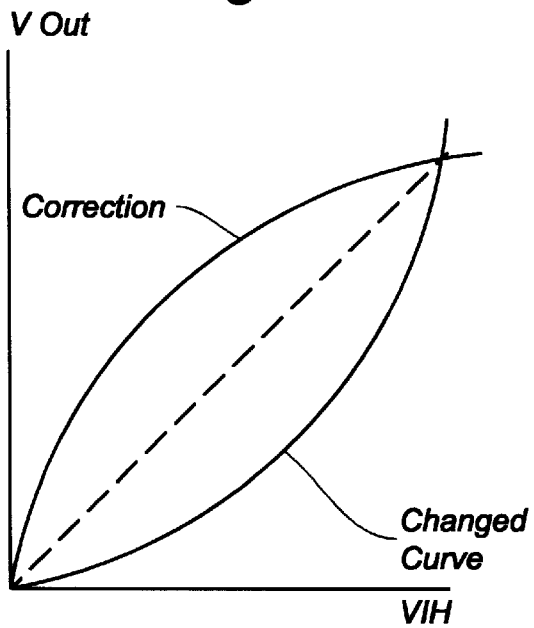
Figure 3D:
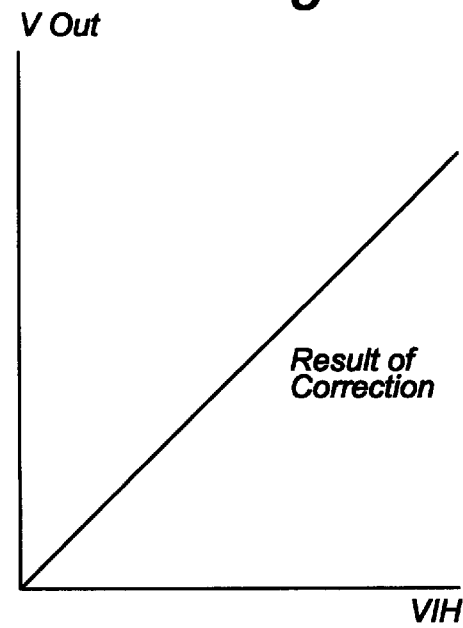
Figure 4:
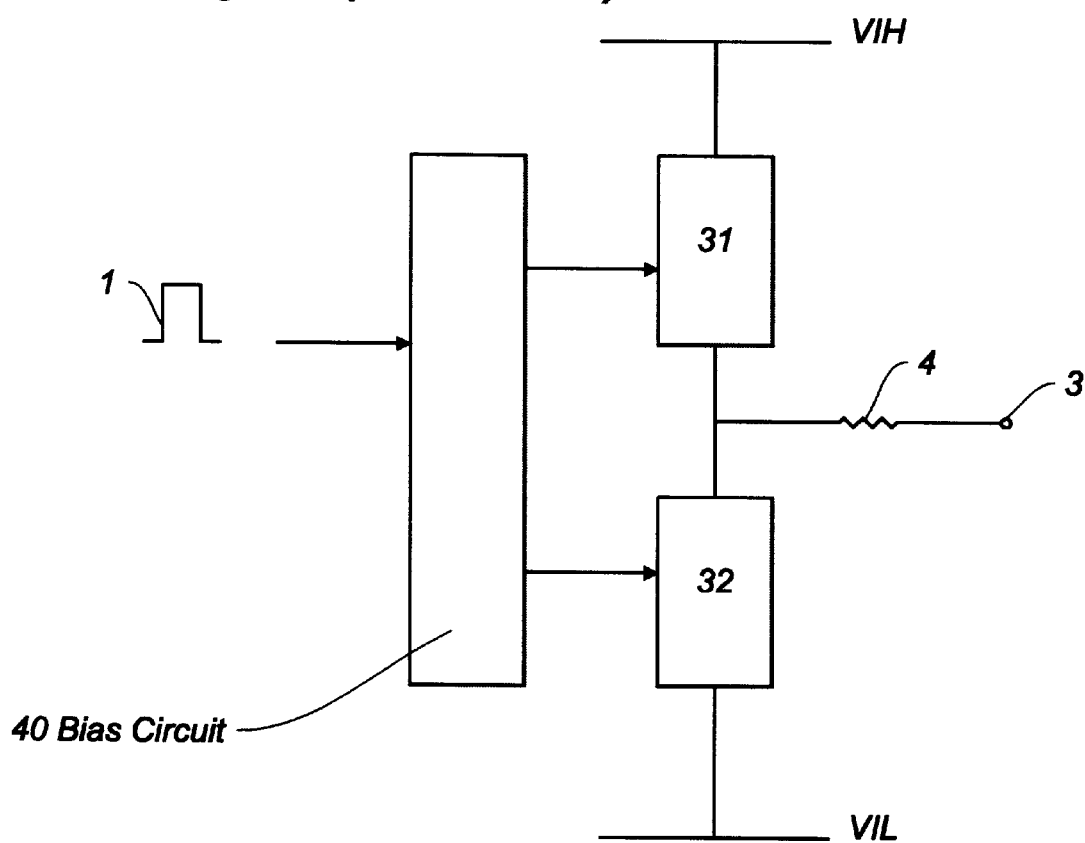
FIG. 4 is a block diagram showing a driver circuit without a temperature correction circuit in the conventional technology.
Figure 5:
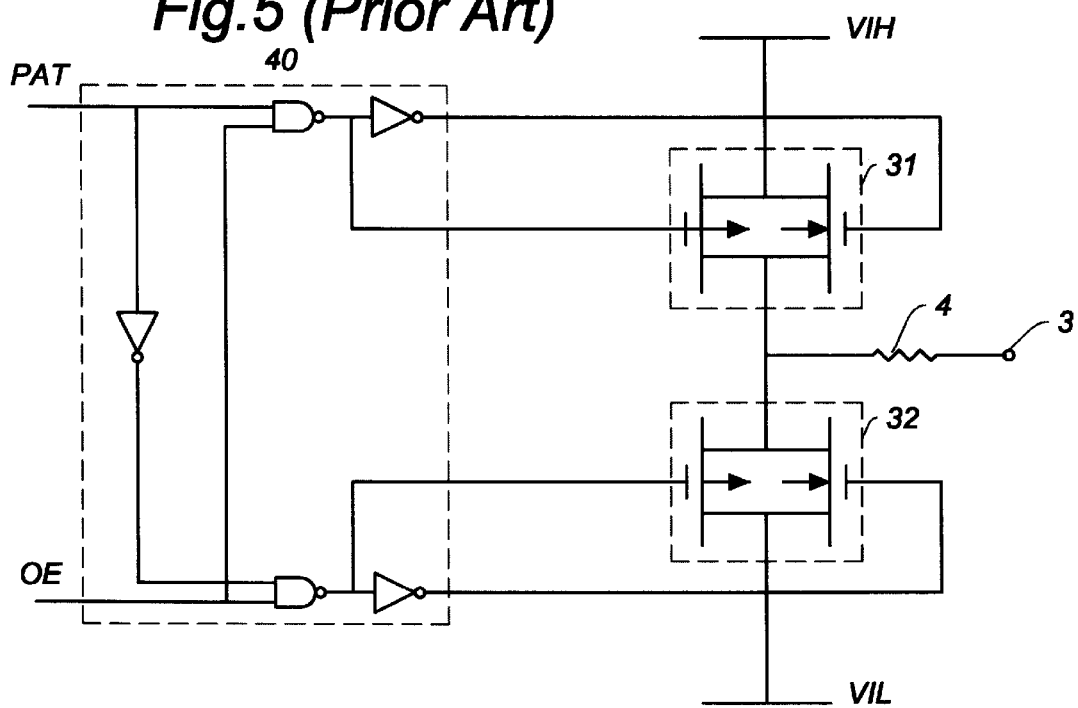
FIG. 5 is a circuit diagram showing a detailed structure of the driver circuit without a temperature correction circuit in the conventional technology.
Figure 6:
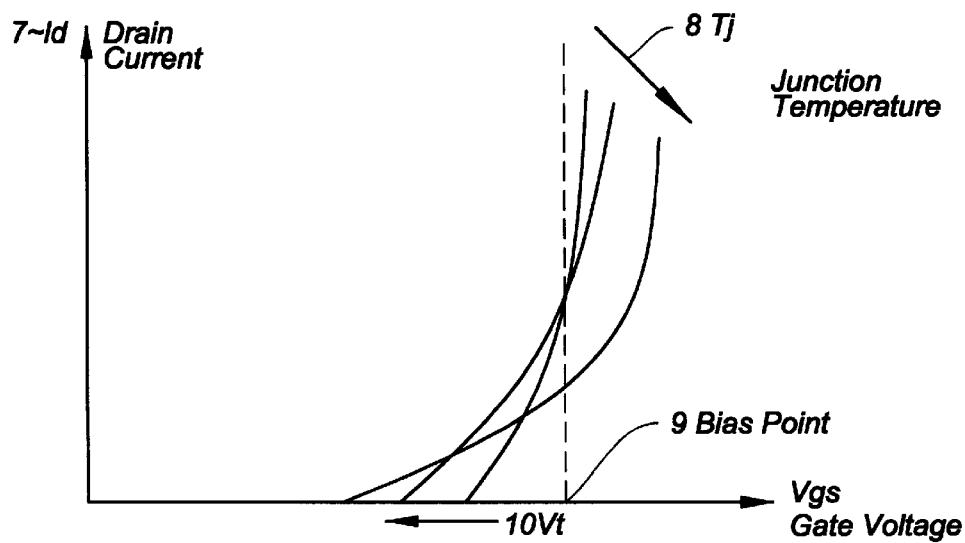
FIG. 6 is a diagram showing an example of drain-current versus gate voltage characteristic of an output element of the driver circuit when the temperature of the output element varies.
Figure 7A:
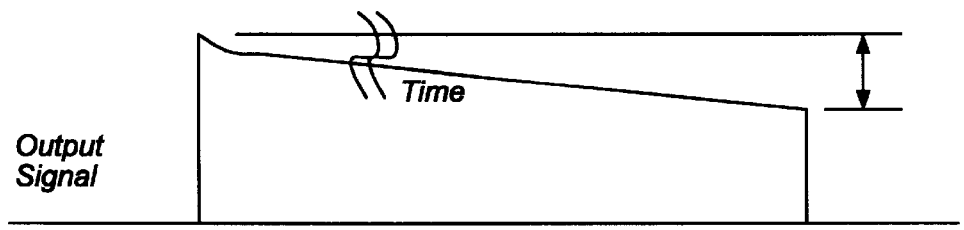
FIG. 7A is a diagram showing the changes in the output level as a function of time when the temperature increases.
Figure 7B:
FIGS. 7B–7D are diagrams showing examples of timing deviation between an input signal and an output signal.
Figure 7C:
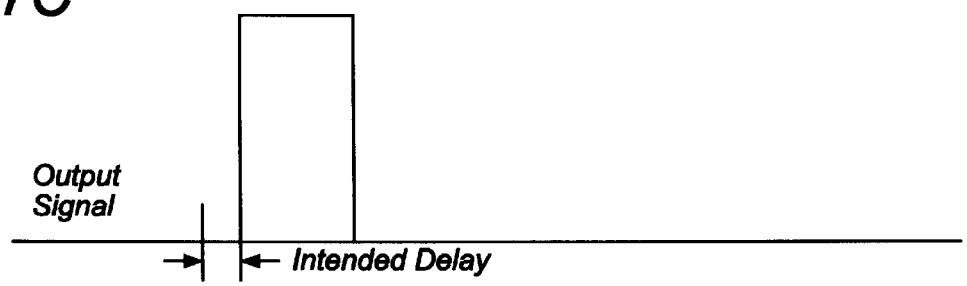
Figure 7D:
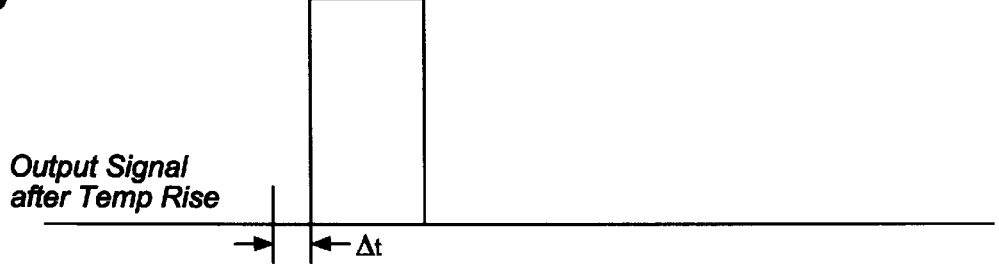

The basic principle of temperature correction is explained with reference to FIG. 3A–3D which show input/output characteristics with respect to the temperature changes. FIG. 3A shows an ideal characteristic required as an output voltage signal wherein the output voltage level is proportional to the input voltage level in a constant manner. FIG. 3B shows a situation where the relationship between the input voltage and the output voltage is non-linear due to the heat dissipated by the junctions of the output elements 31 and 32. In response to this non-linear relationship of FIG. 3B, the present invention establishes a correction curve of input/output relationship as shown in FIG. 3C in the temperature correction circuit. The correction curve is inverse to the non-linear relationship of FIG. 3B. Therefore, the output/input voltage relationship is corrected to be almost a straight line as shown in FIG. 3D to reduce the adverse effects by the temperature change.

The driver circuit having the temperature correction function of the present invention is explained in the following with reference to FIG. 1. The driver circuit is formed with output elements 31 and 32, electric current detection resistors 33 and 34, differential amplifiers 33*b* and 34*b*, electric power monitor circuits 35 and 36, correction circuits 37 and 38, a timing adjustment circuit 39 and a bias circuit 40.

The electric current detection resistors 33 and 34 are resistance to detect electric current flowing through the corresponding output elements 31 and 32. The differential amplifiers 33*b* and 34*b* are provided to stabilize the electric voltage supplied to the corresponding voltage source terminals of the output elements 31 and 32.

The electric power monitor circuits 35 and 36 detect voltage drops across the electric current detection resistors 33 and 34, respectively. The monitor circuits 35 and 36 provide temperature detection signals 22 and 23 to the correction circuits 37 and 38, respectively. The correction circuits 37 and 38 receive the respective temperature detection signals 22 and 23, and generate correction signals 51, 52, 53 and 54 as voltage sources (ViH, ViL) to be provided to the timing adjustment circuit 39 and the bias circuit 40.

The timing adjustment circuit 39 has a variable delay time function therein. When receiving the delay time correction signals 53 and 54 from the correction circuits 37 and 38, respectively, the timing adjustment circuit 39 adjusts delay times of drive signals 41 and 42 therefrom to be provided to the output elements 31 and 32 through the bias circuit 40.

The bias circuit 40 has a variable amplitude function therein. When receiving the amplitude correction signals 51 and 52 from the correction circuits 37 and 38, respectively, the bias circuit 40 provides drive signals having corrected amplitude levels to the input terminals of the corresponding output elements 31 and 32.

The more detailed example of the driver circuit corresponding to the schematic block diagram of FIG. 1 is shown in FIG. 2. In this example, the output elements 31 and 32 are formed with CMOS transfer gates. The timing adjustment circuit 39 has a level shifter and a variable delay circuit. The variable delay circuit in this example has a plurality of series connected CMOS gates which receive the correction signals 53 and 54 as voltage sources. By regulating the value of voltage sources to the plurality of CMOS gates, the signal propagation delay time between the input signal and the output signal for the plural CMOS gates is fine-adjusted to establish the variable delay time circuit. The level shifter 2 is a circuit to produce a differential output signal upon receiving an input signal 1 and shifts the voltage level of the differential output signal therefrom.

The bias circuit 40 receives drive signals 41 and 42 from the timing adjustment circuit 39 and regulates the amplitude of the driver signals based on the correction signals (voltage sources) 51 and 52 from the correction circuits 37 and 38. An example of the bias circuit 40 includes a pair of CMOS gate circuits as shown in FIG. 2. The pair of CMOS gate circuits receives the drive signals 41 and 42, respectively. The amplitudes of the drive signals 41 and 42 are regulated by the value of voltage sources 51 and 52 to the pair of CMOS gate circuits.

In the electric power monitor circuits 35 and 36, integration circuits 20 and 21 respectively integrate periodic voltage signals detected by the current detection resistors 33 and 34. The integration circuits 20 and 21 provide resultant average voltage signals to the correction circuits 37 and 38 as temperature detection signals 22 and 23, respectively.

In receiving the temperature detection signals 22 and 23 from the electric power monitor circuits 35 and 36, the correction circuits 37 and 38 provide the correction signals 51, 52, 53 and 54 which work as source voltages (ViH, ViL) to the timing adjustment circuit 39 and the bias circuit 40. Each of the correction circuits 37 and 38 is formed, for example, of a correction coefficient circuit, an adder circuit, and a subtraction circuit.

The correction coefficient circuits K43, K44, K45 and K46 in the correction circuits 37 and 38 are to fine adjust the curves when receiving the signals from electric power monitor circuit 35 and 36. The correction coefficient circuits K43–K46 adjust gains and curves of the non-linear characteristics of the output temperature timing and output temperature amplitude of the output elements 31 and 32. Preferably, the correction coefficients are pre-adjusted before being installed in the driver circuit.

Figure 13:
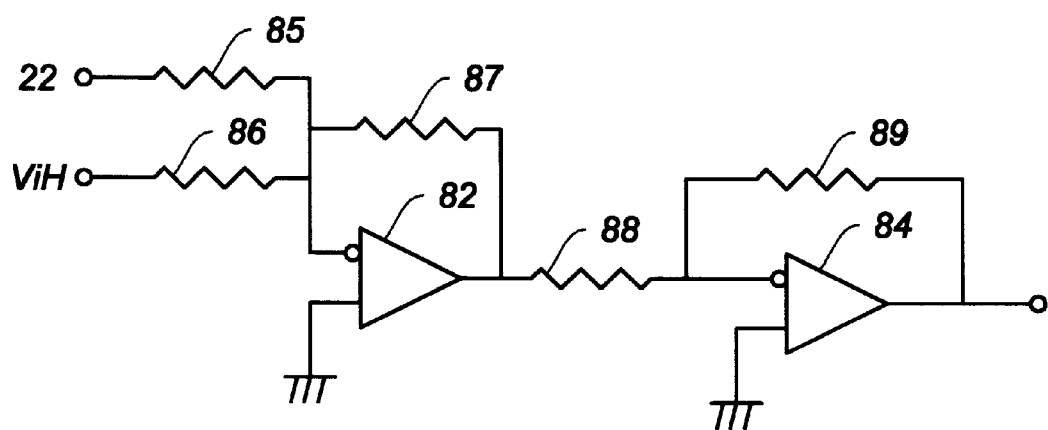
FIG. 13 is a diagram showing an example of structure of the correction circuit to be used in the driver circuit of the present invention.

An example of the correction circuit is shown in FIG. 13 which is directed to a partial circuit configuration corresponding to the left portion of the correction circuit 37. In this example, operational amplifiers 82 and 84 and resistors 85–89 are used. The resistors 85–89 are connected to the operational amplifiers 82 and 84 in the manner as shown in FIG. 13 to form the inverting amplifiers series connected with one another. The temperature detection signal 22 from the power monitor circuit 35 and the positive voltage source ViH is added at the input of the first inverting amplifier to combine the two input signals. The output of the amplifier 84 is provided to the timing adjustment circuit 39 of FIG. 2 as a control signal.

Although not shown, the correction circuit of FIG. 13 may include a non-linear element such as a diode to establish a curve such as shown in FIG. 3C to compensate the non-linear characteristics of the output elements 31 and 32. By the correction circuits, signals corrected in the gain/curves are provided to the timing adjustment circuit 39 and bias circuit 40.

The correction circuits 37 and 38 provide correction signals (voltage sources) to the timing adjustment circuit 39 and bias circuit 40 as correction signals. Based on the value of voltage sources to the plurality of CMOS gates in the timing adjustment circuit 39, the signal propagation delay time between the input signal and the output signal for the plural gates is controlled. Similarly, based on the value of voltage sources provided to the bias circuit 40, the amplitude of the drive signals 41 and 42 is controlled. Thus, the timing adjustment circuit 39 carries out the function of fine adjusting the signal propagation delay times in the plurality of gates, and the bias circuit 40 carries out the function of fine adjusting the amplitude of the signals to be provided to the output elements 31 and 32.

Because of the configuration of the present invention noted above, in response to the temperature changes due to the electric power consumption in the output elements 31 and 32, the resultant changes in the output amplitude and impedance or the change in the output signal timing can be corrected. As a consequence, the driver circuit is able to produce output amplitudes and timings with high precision and stability.

In the foregoing embodiment shown in FIG. 2, the driver circuit utilizes CMOS gates. However, it is also possible to form the driver circuit with other semiconductor circuits such as a bipolar circuit accompanied by peripheral circuits suitable for the bipolar circuit.

In the foregoing explanation of the embodiment of the present invention, the temperature changes of the output elements 31 and 32 are detected by the electric power monitor circuits 35 and 36 by measuring the voltage drops across the resistors 33 and 34. However, it is also possible to detect the temperature change by other sensors such as a thermostat or a posistor provided close to the output elements 31 and 32. Furthermore, it is possible to include a temperature sensor for detecting the temperature of the IC chip as a whole and the detected result may be combined with the detected temperature of the output elements 31 and 32.

Figure 8:
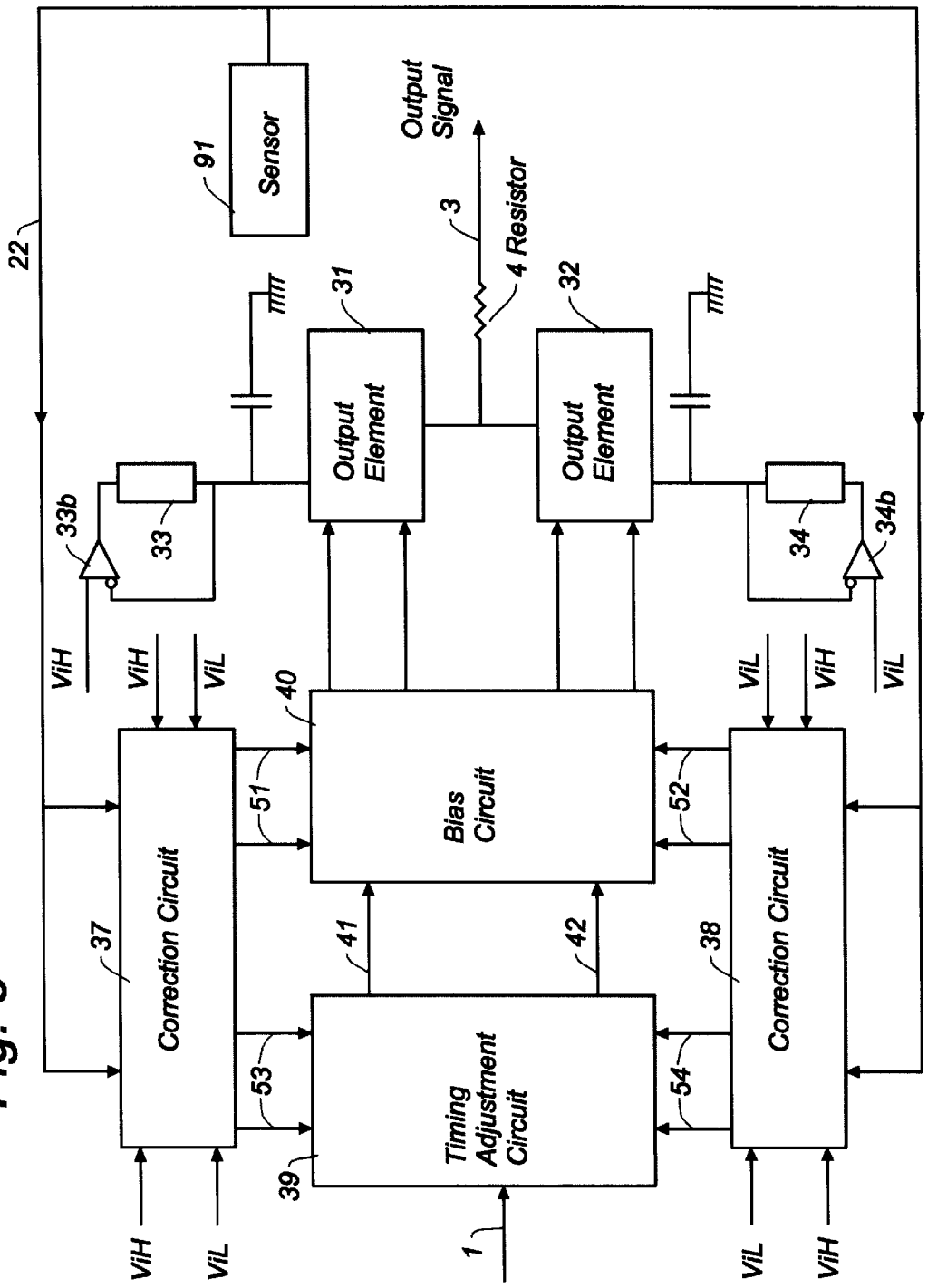
FIG. 8 is a block diagram showing a driver circuit of the present invention having a temperature sensor for detecting temperature changes in one of the output elements.

Such various ways of temperature sensing are shown in FIGS. 8–11. FIG. 8 is a block diagram showing the driver circuit of the present invention having a temperature sensor for detecting temperature changes in one of the output elements. A temperature sensor 91 is provided in close proximity to the output element 31 to detect the temperature of the output element 31. In this example, the output of the temperature sensor 91 is directly supplied to the correction circuits 37 and 38 to control the output timing and the output amplitude of the driver circuit.

Figure 9:
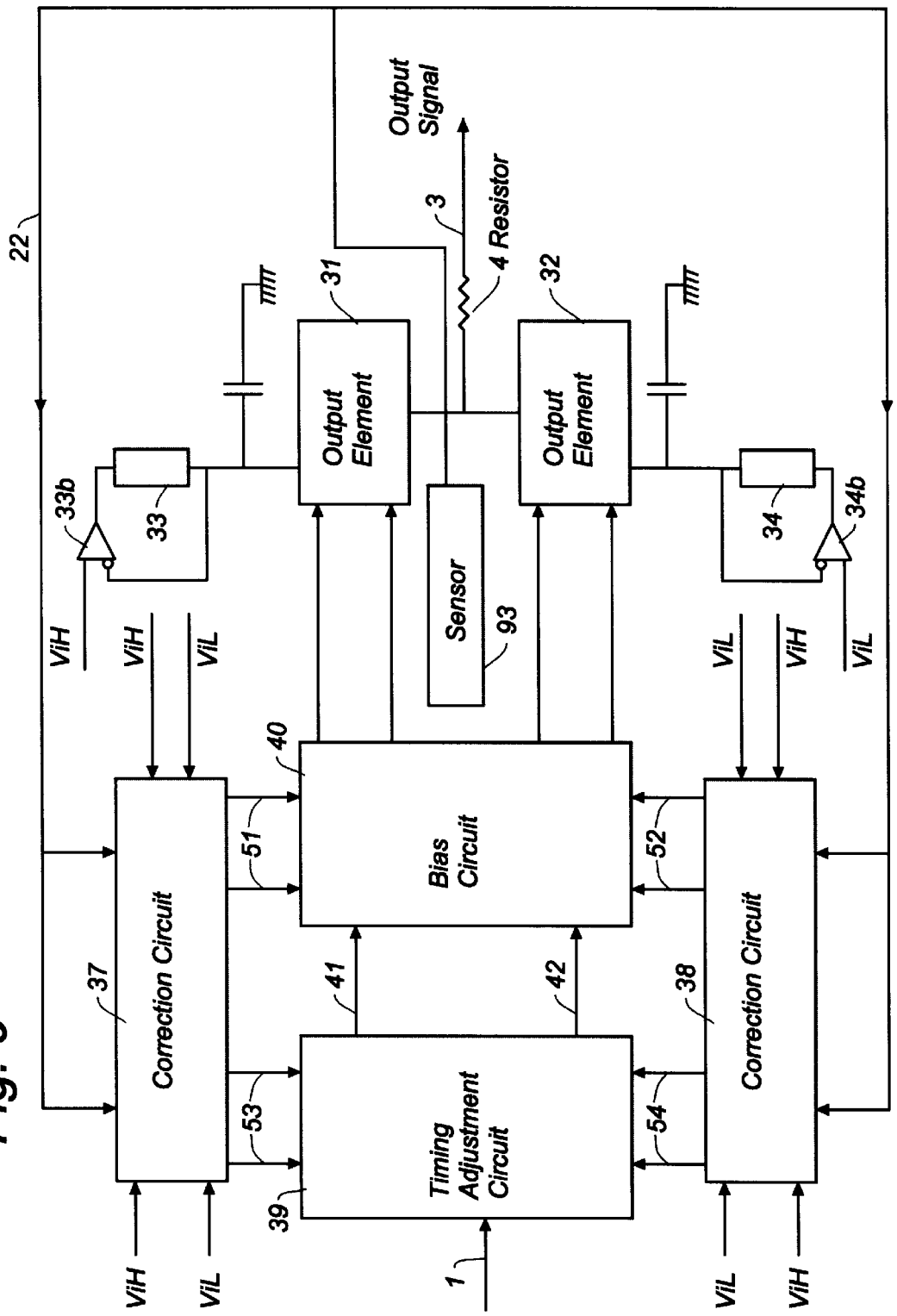
FIG. 9 is a block diagram showing a driver circuit of the present invention having a temperature sensor for detecting temperature changes common to both of the output elements.

FIG. 9 is a block diagram showing the driver circuit of the present invention having a temperature sensor for detecting temperature changes common to both of the output elements. A temperature sensor 93 is provided in close proximity to both the output elements 31 and 32 to detect the temperature of the output elements 31 and 32. If the overall size of the driver circuit is small enough, the temperature sensor 93 may also function to sense the temperature of the driver circuit as a whole. In this example, the output of the temperature sensor 93 is directly supplied to the correction circuits 37 and 38 to control the output timing and amplitude of the driver circuit.

Figure 10:
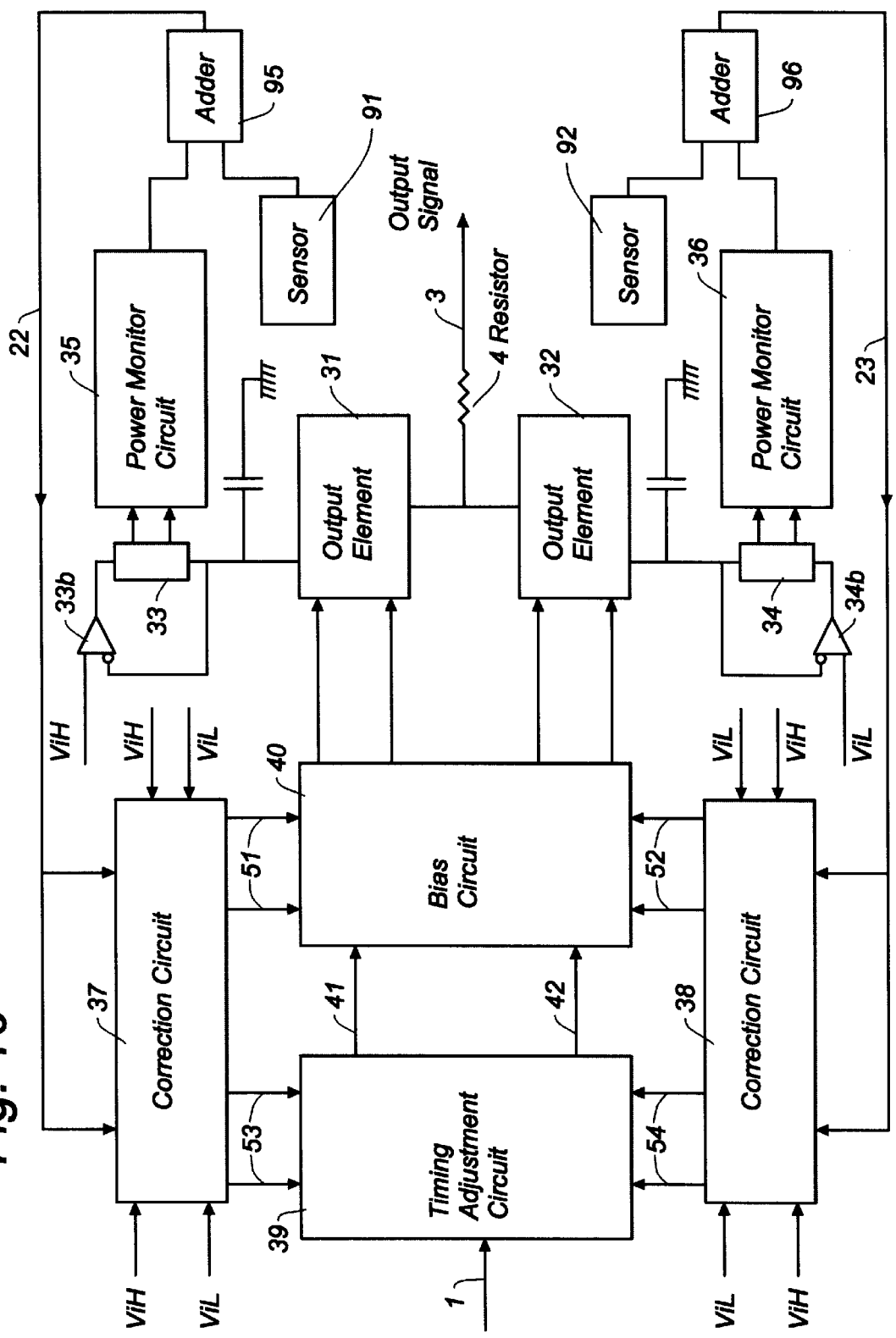
FIG. 10 is a block diagram showing a driver circuit of the present invention having a pair of temperature sensors for detecting temperature changes in the output elements and a pair of adder circuits for combining the output signals of the temperature sensors and signals showing output currents of the output elements.

FIG. 10 is a block diagram showing a driver circuit of the present invention having a pair of temperature sensors for detecting temperature changes in the output elements and a pair of adder circuits for combining the output signals of the temperature sensors and the output signals of the power monitor circuit showing the amounts of current flowing through the output elements. A temperature sensor 91 is provided to sense the temperature change in the output element 31. A temperature sensor 92 is provided to sense the temperature change in the output element 32.

The output signals of the temperature sensor 91 and of the power monitor circuit 35 are combined by an adder circuit 95 whose output is provided to the correction circuit 37. The output signals of the temperature sensor 92 and of the power monitor circuit 36 are combined by an adder circuit 96 whose output is provided to the correction circuit 38. Since the arrangement of FIG. 10 can regulate the output timing and amplitude based on the current flowing in the output elements as well as the temperature of the output elements, it is expected that more precise temperature correction is achieved in the driver circuit.

Figure 11:
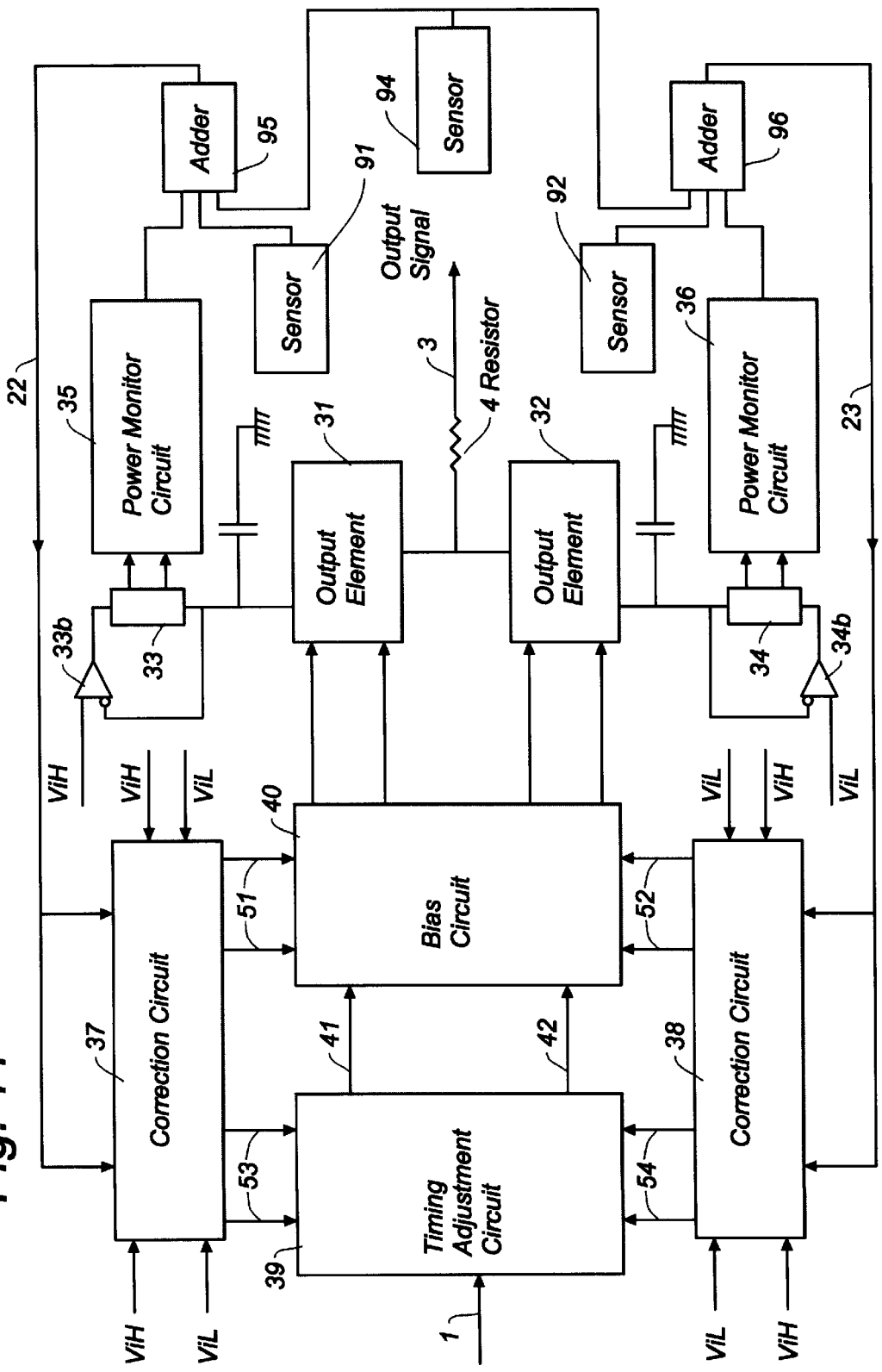
FIG. 11 is a block diagram showing a driver circuit of the present invention having a temperature sensor further to the pair of temperature sensors and the pair of adder circuits of FIG. 10.

FIG. 11 is a block diagram showing a driver circuit of the present invention having a temperature sensor further to the pair of temperature sensors and the pair of adder circuits of FIG. 10. In this example, a temperature sensor 94 is additionally provided to sense the temperature of the driver circuit as a whole. The output signal of the temperature sensor 94 is supplied to the adder circuit 95 to be combined with the output signals from the temperature sensor 91 and the power monitor circuit 35. The output signal of the temperature sensor 94 is also supplied to the adder circuit 96 to be combined with the output signals from the temperature sensor 92 and the power monitor circuit 36.

Figure 12:
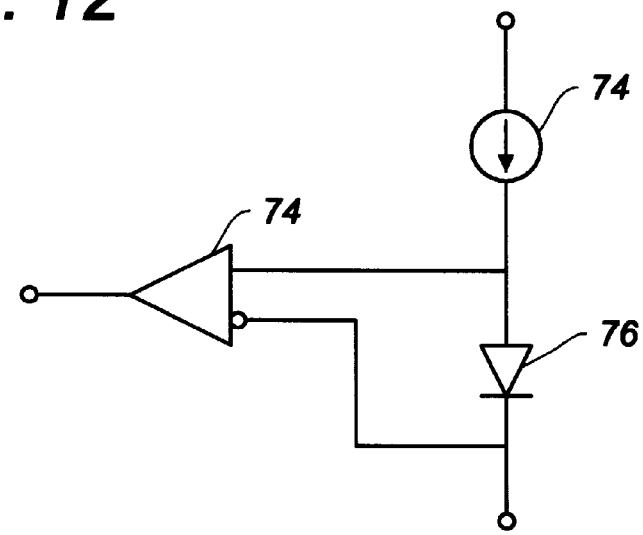
FIG. 12 is a diagram showing an example of structure of the temperature sensor to be used in the driver circuit of the present invention.

An example of temperature sensor to be used in the foregoing examples of FIGS. 8–11 is shown in FIG. 12. In this example, the temperature sensor is formed with a constant current source 74, a temperature sensitive PN junction 76 and a buffer 74. The PN junction 76 is forward biased by the constant current source 74 and a threshold voltage of the PN junction is detected by the buffer 74. The threshold voltage of the PN junction varies in response to the temperature changes. Thus, the change in the output voltage of the buffer 74 represents the temperature surrounding the PN junction 76.

In the foregoing explanation of the embodiment, the timing adjustment circuit 39 has the input signal 1 through a single input line. However, it is also possible to establish the timing adjustment circuit 39 in such a way as to receive an input signal through differential input terminals while eliminating the level shifter 2.

In the explanation for the embodiment of the present invention, the temperature correction is achieved with an emphasis on the temperature changes in the output elements 31 and 32. However, it is also possible to achieve the purpose of the present invention by adjusting the correction coefficient circuits K43, K44, K45 and K46 to compensate the overall temperature characteristics of the driver circuit including the timing adjustment circuit 39, the bias circuit 40, the correction circuits 37 and 38, and the electric power monitor circuits 35 and 36.

Further, in the foregoing explanation of the embodiment of the present invention, the electric power monitor circuits 35 and 36 or the temperature sensor such as the thermostat or a posistor is provided to detect the temperature changes in the output elements 31 and 32, and detection signals are provided to the correction circuits 37 and 38, respectively. In other words, in the foregoing examples, two systems of detection signals are feedbacked to the corresponding two systems of correction circuits. However, it is also possible to achieve the object of the present invention by having a single feedback system with one detection signal and one correction circuit for focusing on only one of the output elements 31 and 32. This enables to simplify the circuit configuration of the driver circuit in case where either one of the high or low output signals are mainly used.

In the foregoing explanation of the embodiments, the temperature change of the output elements 31 and 32 is detected by electric power monitor circuits 35 and 36 or temperature sensor such as the thermostat and posistor. That is, two types of detection signal are provided. However, it is also possible to use only one type of representative detection signal to be given to the correction circuit. For example, a temperature sensor can be arranged to a sense point that is common to both output elements 31 and 32 to take out a detection signal representative of both output elements. Moreover, the output signal of electric power monitor circuits 35 and 36 can be averaged and used as a representative detection signal. This enables to simplify the circuit configuration of the present invention when the high level and low level circuits in the driver circuit are used in substantially the same manner.

Because of the temperature correction voltages from the correction circuits 37 and 38, the signal propagation delay time between the input and output of the plural gates connected in series in the timing correction circuit 39 is adjusted. Consequently, the temperature dependency in the output timing of the output signal 3 can be significantly reduced.

Because of the temperature correction voltages from the correction circuits 37 and 38, the amplitude and impedance in the amplitude and impedance correction circuit 40 is adjusted. Consequently, the temperature dependency in the output amplitude and impedance of the output signal 3 can be significantly reduced.

As a result, the fluctuation in the output signal amplitude, the output impedance and the output timing can be corrected in response to the change in the heat dissipation caused by the electric consumption in the output elements 31 and 32. Thus, a driver circuit of precise and stable signal amplitude and precise timing can be realized. Moreover, unlike the conventional technology, it is possible to obviate the use of a forceful cooler or an air conditioner or cooling system to maintain the temperature surrounding the driver circuit constant.

Although only preferred embodiments are specifically illustrated and described herein, it will be appreciated that many modifications and variations of the present invention are possible in light of the above teachings and within the purview of the appended claims without departing the spirit and intended scope of the invention.

What is claimed is:

1. A driver circuit comprising:

output elements formed in a complementary structure to receive an input pulse signal and generate an output pulse signal with a predetermined signal amplitude and timing;

a temperature detector for detecting a temperature change in the output elements;

a timing adjustment circuit for correcting temperature changes in timings in the output pulse signal relative to the input pulse signal upon receiving a temperature detection signal from the temperature detector;

a bias circuit for correcting temperature changes in amplitude and impedance of the output pulse signal upon receiving the temperature detection signal from the temperature detector;

a power consumption monitor circuit for monitoring power consumed in the output elements; and an adder circuit for combining a temperature change detection signal from the temperature detector and an output signal from the power consumption monitor circuit and for producing a control signal to be provided to the timing adjustment circuit and the bias circuit.

2. A driver circuit as defined in claim 1, wherein the temperature detector is positioned in close proximity to one of the output elements to detect temperature changes in the output element.

3. A driver circuit as defined in claim 1, wherein the temperature detector is positioned in close proximity to both output elements to detect temperature changes common to both output elements.

4. A driver circuit as defined in claim 1, wherein the power consumption monitor circuit monitors the power consumed in the output elements by detecting an amount of current flowing through the output elements and producing the output signal therefrom representing the amount of the current.

5. A driver circuit having a temperature correction circuit and output elements formed in a complimentary structure to receive an input signal and generates an output signal with a predetermined signal amplitude and output timing, said driver circuit comprising:

a temperature detection means for detecting a temperature change in the output elements;

an output timing temperature correction means for correcting temperature changes in output timings in said output signal relative to said input signal upon receiving a temperature detection signal from said temperature detection means;

an output amplitude and impedance temperature correction means for correcting temperature changes in output amplitudes and output impedance of said output signal upon receiving said temperature detection signal from said temperature detection means; and means for adjusting a source voltage for the output timing temperature correction means or the output amplitude and impedance temperature correction means in response to said detection signal from said temperature detection means.

6. A driver circuit as defined in claim 5, wherein said temperature detection means detects temperature changes in one of said output elements.

7. A driver circuit as defined in claim 5, wherein said temperature detection means detects temperature changes in both of said output elements.

8. A driver circuit having a temperature correction circuit as defined in claim 5 wherein said temperature detection means detects said temperature change by monitoring electric current flowing through said output elements.

9. A driver circuit having a temperature correction circuit as defined in claim 5 wherein said temperature detection means detects said temperature change by providing a temperature sensor adjacent to said output elements.

10. A driver circuit having a temperature correction circuit as defined in claim 5 wherein said temperature detection means combines a detection signal based on monitoring an electric current flowing through said output elements and a detection signal based on temperature detected by a temperature sensor provided adjacent to the output elements.

11. A driver circuit having a temperature correction circuit as defined in claim 5 wherein said temperature detection means combines a detection signal based on monitoring an electric current flowing through said output elements and a detection signal based on temperature detected by a temperature sensor provided adjacent to the output elements and a detection signal based on temperature of a chip as a whole forming said driver circuit.

12. A driver circuit having a temperature correction circuit as defined in claim 5 wherein said output timing temperature correction means is comprised of a plurality of gates connected in series whose source voltage is controlled by said means for adjusting the source voltage, thereby regulating signal propagation delay times between input and output signals of said gates.

13. A driver circuit having a temperature correction circuit as defined in claim 5 wherein said output amplitude and impedance temperature correction means is comprised of a buffer circuit whose source voltage is controlled by said means for adjusting the source voltage, thereby regulating said output amplitudes of said output signal.

* * * * *